United States Patent [19]

Wada et al.

[11] Patent Number: 4,716,323
[45] Date of Patent: Dec. 29, 1987

[54] POWER VOLTAGE DROP DETECTING CIRCUIT

[75] Inventors: Tetsuro Wada, Yokohama; Yasuo Ohkubo, Tokyo, both of Japan

[73] Assignee: Kabushiki Kaisha Toshiba, Kawasaki, Japan

[21] Appl. No.: 855,595

[22] Filed: Apr. 25, 1986

[30] Foreign Application Priority Data

Apr. 27, 1985 [JP] Japan .................................. 60-91419
Jan. 13, 1986 [JP] Japan .................................... 61-4788

[51] Int. Cl.$^4$ .................. H03K 17/284; H03K 17/22; H03K 17/20; H03K 17/30
[52] U.S. Cl. ................................ 307/594; 307/200 B; 307/603; 307/605; 307/362; 307/304; 371/25; 371/66; 340/663
[58] Field of Search ............ 307/200 B, 443, 450–452, 307/573–577, 579, 584, 585, 270, 255, 304, 473, 360, 263, 592, 593, 594, 597, 603, 605, 362; 371/25, 66; 365/228; 340/663, 636

[56] References Cited

U.S. PATENT DOCUMENTS

| 3,654,496 | 4/1972 | Flad | 307/605 |
| 3,913,006 | 10/1975 | Fillmore | 307/304 X |
| 3,975,649 | 8/1976 | Kawagoe et al. | 307/304 |
| 4,103,187 | 7/1978 | Imamura | 307/585 |
| 4,140,930 | 2/1979 | Tanaka | 307/585 X |
| 4,293,782 | 10/1981 | Tanaka et al. | 307/304 X |
| 4,366,560 | 12/1982 | McDermott et al. | 307/362 X |
| 4,399,372 | 8/1983 | Tanimoto et al. | 307/304 X |
| 4,607,178 | 8/1986 | Sugie et al. | 307/594 |

FOREIGN PATENT DOCUMENTS

| 0037463 | 3/1979 | Japan | 307/594 |
| 0079333 | 5/1983 | Japan | 307/594 |
| 2059707 | 4/1981 | United Kingdom | 307/594 |

Primary Examiner—Stanley D. Miller
Assistant Examiner—David R. Bertelson
Attorney, Agent, or Firm—Finnegan, Henderson, Farabow, Garrett & Dunner

[57] ABSTRACT

A power voltage drop detecting circuit includes VDD and ground terminals supplied with power voltage VD, a resistor connected at one end to the VDD terminal, a MOS transistor connected between the other end of the resistor and the ground terminal, and a CMOS inverter for producing an output signal according to a voltage at the junction between the resistor and the MOS transistor. The detecting circuit further includes a control pad connected to the control gate of the n-channel MOS transistor and supplied with control voltage VC at different levels in the test mode and detect modes, respectively.

7 Claims, 11 Drawing Figures

POWER VOLTAGE DROP DETECTING CIRCUIT

BACKGROUND OF THE INVENTION

This invention relates to a power voltage drop detecting circuit and, more particularly, to a power voltage drop detecting circuit formed on, for example, a CMOS type microcomputer LSI chip.

Lately, microcomputer LSIs are used for controlling fuel injection in automobile engines. Most of these LSIs each contain a RAM for storing the important data generated for fuel injection control. Even when the CPU of the microcomputer is in the standby mode and not operating, the RAM must retain this data. However, when the power voltage supplied to the microcomputer LSI drops, there is a risk that the control data contains incorrect values. To avoid this risk, a voltage drop detecting circuit, which can detect a power voltage drop below a predetermined value, is provided in the LSI chip.

When the detection circuit detects a voltage drop, the data is prepared again and stored in the RAM. When no voltage drop is detected, the data is considered to have been correctly stored in the RAM. The data can be used for engine control after the CPU is released from the standby mode.

FIG. 1 shows a conventional power voltage drop detection circuit. This detecting circuit uses a pair of enhancement type MOS transistors Q1 and Q3 and another pair of depletion type MOS transistors Q2 and Q4. Transistors Q1 and Q2 form voltage dividing circuit 10 between VDD terminal and the ground terminal, while transistors Q3 and Q4 form inverter 12 for digitizing the output signal of the voltage dividing circuit 10. In operation, the output signal of voltage dividing circuit 10 lessens with the drop of the power voltage. When the power voltage falls below a predetermined value, the transistors of inverter 12 are turned off, and the inverter outputs a signal at a high level. The output signal is inverted by second inverter 14 and supplied to the reset terminal $\overline{R}$ of RS flip-flop 16. Flip-flop 16, in response to this signal, produces a high level signal from $\overline{Q}$ output terminal in the form of a power voltage detecting signal.

When the microcomputer LSI has a CMOS structure, the conventional power voltage drop detecting circuit has the following disadvantages. Only enhancement type MOS transistors are used, as circuit elements, for constructing CPU, RAMs, etc. For this reason, if depletion type MOS transistors of the detector circuit are to be formed together with enhancement type MOS transistors in the same semiconductor substrate, the manufacturing process is more complicated. As a result, the conventional detector circuit is expensive and cannot be readily used in microprocessor CMOS LSIs.

If the detector circuit of FIG. 1 comprises CMOS type elements, it could be arranged as shown in FIG. 2. This circuit uses n-channel type enhancement MOS transistor Q5 and diffusion resistor R for a voltage dividing circuit, and p-channel and n-channel type enhancement transistors Q6 and Q7 for a CMOS inverter. The output signal of the CMOS inverter is supplied to the reset terminal of CMOS flip-flop 18. Power source terminal VDD is connected to the input terminal of the voltage dividing circuit, that is to say, the gate of MOS transistor Q5.

In the detector circuit of FIG. 2, the current of in the order of at least $10^{-6}$ ampere flows at about room temperature. In the case of CMOS LSI, in the standby mode, the current in the order of $10^{-10}$ to $10^{-9}$ will flow in the same temperature condition. This current is generally used in inspecting for defective CMOS LSIs. When the standby current falls out of the specified range, the corresponding CMOS microcomputer LSI is considered defective.

The incorporating of the detector circuit of FIG. 2 into the CMOS LSI is undesirable in view of other factors than the manufacturing cost. The current consumed by this detector circuit is considerably larger than the standby current. The difference in standby current cannot be detected due to the fluctuation of the consumed current, so that it is difficult to use it for defective CMOS LSI testing.

FIG. 3 represents the relationship of the CMOS LSI standby current and the consumed current of the power supply voltage drop detector. The broken line shows the consumed current level of the power voltage drop detector circuit. Solid line A shows a relationship of the standby current of a correctly operating CMOS LSI to the ambient temperature. Solid line B shows the same relationship observed with a defective CMOS LSI. As FIG. 3 shows, the difference between the standby currents of good and defective MOS LSIs at room temperature can be clearly seen. Actually, however, the current consumed by the power voltage drop circuit shown in FIG. 2 eliminates these current differences.

For this reason, the power voltage drop detecting circuit of FIG. 2 cannot hardly be readily used in the CMOS LSI.

SUMMARY OF THE INVENTION

Accordingly, an object of the present invention is to provide a power voltage drop detecting circuit which has a structure easily adaptable for CMOS LSIs.

According to the present invention, a power voltage drop detecting circuit to be formed on an LSI chip comprises first and second power terminals supplied with power voltage; a voltage dividing circuit, having a resistor and a MOS transistor connected in series between the first and second power source terminals, for dividing the power voltage; a CMOS inverter for producing an output voltage according to the output voltage of the voltage dividing circuit; and a control pad connected to the gate of the MOS transistor and set at different potentials in the test and detect modes.

BRIEF DESCRIPTION OF THE INVENTION

DETAILED DESCRIPTION OF THE PREFERRED EMBODIMENTS

Figure 4:
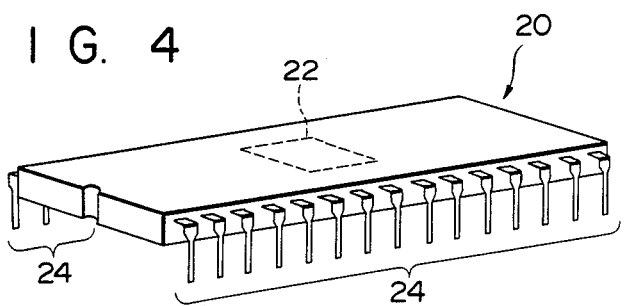
FIG. 4 shows an external view of a CMOS type microcomputer LSI device for explaining a power voltage drop detecting circuit according to an embodiment of the present invention.
Figure 5:
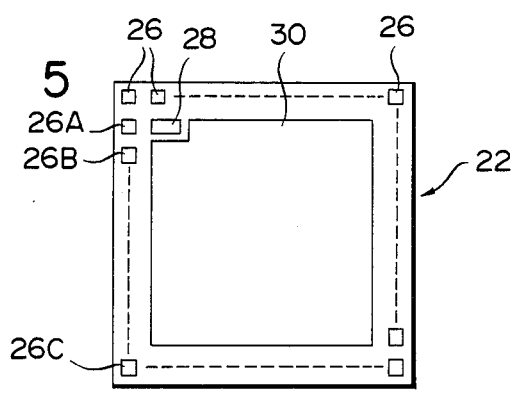
FIG. 5 shows a plan view of an LSI chip 22 accommodated in a package of the LSI device 20 of FIG. 4.

A power voltage drop detecting circuit according to an embodiment of the present invention will be described referring to FIGS. 4 to 6. FIG. 4 shows an external view of a CMOS type microcomputer LSI device 20. FIG. 5 shows an LSI chip 22 accommodated in the package of the LSI device 20. Package pins 24 shown in FIG. 4 are connected to bonding pads 26, which are formed on the peripheral sides of LSI modules 22 as shown in FIG. 5. The bonding pads 26A to 26C are used respectively as control, VDD and ground terminals. The VDD terminal, together with the ground terminal, receives power voltage VD usually in VDD level. The control terminal, together with the ground terminal, receives control voltage VC. In a test mode, the control voltage VC is set at a low level, for example, ground level of OV. In a detection mode, it is set at a high level, e.g. VDD level of 5 V.

The power voltage drop detecting circuit 28 is formed on LSI chip 22 together with microcomputer circuit 30.

Circuit 30 includes logic circuits such as CMOS type CPU, RAM and the like. Circuits 28 and 30 are connected to bonding pads 26B and 26C in order to receive power voltage VD. Circuit 28 is further connected to bonding pad 26A for receiving control voltage VC.

Figure 6:
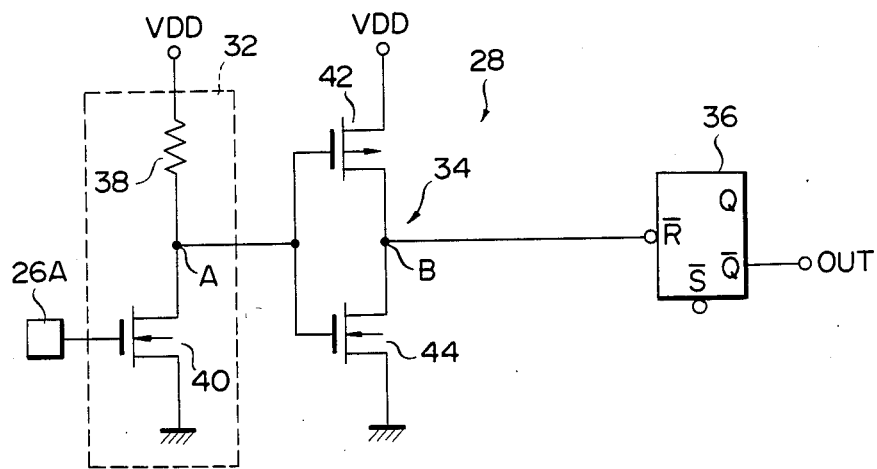
FIG. 6 shows a circuit diagram of a power voltage drop detecting circuit 28 according to a first embodiment of the present invention formed in the LSI chip shown in FIG. 5.

To be more specific, as shown in the preferred embodiment illustrated in FIG. 6, power voltage drop detection circuit 28 includes voltage dividing circuit 32, CMOS inverter 34, and RS flip-flop 36 of CMOS type. Voltage dividing circuit 32 includes diffusion resistor 38, and n-channel type enhancement MOS transistor 40. One end of resistor 38 is connected to the VDD terminal, while the other end is connected to the ground terminal, through the current path of MOS transistor 40. The gate of MOS transistor 40 is connected to bonding pad 26A.

CMOS inverter 34 includes p- and n-channel type enhancement MOS transistors 42 and 44. One end of the current path of MOS transistor 42 is connected to the VDD terminal, while the other end is connected to the ground terminal via the current path of MOS transistor 44. The gates of MOS transistors 42 and 44 are connected to the junction of diffusion resistor 38 and transistor 40. The reset terminal $\overline{R}$ of RS flip-flop 36 is connected to the junction of the current paths of transistors 42 and 44. The output terminal $\overline{Q}$ of RS flip-flop 36 is connected to output terminal OUT of the power voltage drop detector circuit.

The operation of power voltage drop detecting circuit thus arranged will be described.

The standby current of LSI chip 22 is measured before and after its packing for defect inspection. In this case, control voltage VC at ground level is supplied to bonding pad 26A, as a test mode signal. Responsive to the test mode signal, transistor 40 turns off. At this time, no current flows through resistor 38, and voltage dividing circuit 32 does not consume current substantially.

Inverter 34 and RS flip-flop 36 do not consume a large amount of current, because they are of the CMOS type. For this reason, the total consumed current of the detector circuit 28 depends mainly on the current consumed by the voltage dividing circuit 32. When current does not flow into resistor 38 as in the above case, the consumed current of the detector circuit 28 can be ignored. Thus, the standby current measured during the test mode may be used as an indicator to differentiate between good and faulty CMOS LSI devices.

When LSI device 10 is mounted to a circuit board for the purpose of applying microcomputer circuit 30, for example, to the engine control, control voltage VC at VDD level is supplied, as a detecting mode signal, to bonding pad 26A by wirings of package pins 24. As a result, voltage dividing circuit 32 produces from the output terminal A output voltage VA shown in FIG. 7 according to the power voltage VD.

Figure 7:
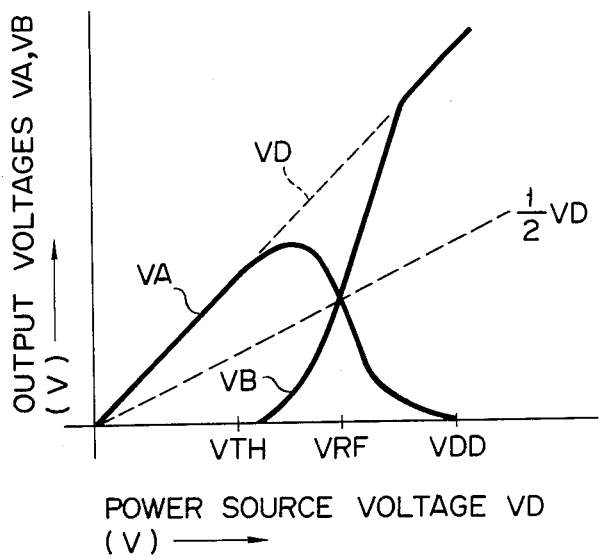
FIG. 7 shows a graph for explaining the operation of the power voltage drop detecting circuit shown in FIG. 6.

According to output voltage VA of voltage dividing circuit 32, inverter 34 produces from the output terminal B output voltage VB shown in FIG. 7. For example, when power voltage VD is not varied but kept at VDD level higher than threshold voltage VTH (tr) of MOS transistor 40, MOS transistor 40 is completely conductive and a VDD level voltage drops by resistor 38. Therefore, voltage dividing circuit 32 produces output voltage VA at ground level. This output voltage VA is lower than ½ VD, i.e. the threshold voltage VTH (inv) of inverter 34, so that inverter 34 produces output voltage VB at VDD level, i.e. high level. During this period, flip-flop 36 is not reset.

When the power voltage VD is in a higher range than the threshold voltage of the MOS transistor 40, MOS transistor 40 is conductive to allow current to flow into resistor 38. Due to voltage drop across this resistor 38, output voltage VA is set to a level lower than power voltage VD. When power voltage VD drops from VDD level to a predetermined VRF level, output voltage VA increases to the same level as the threshold voltage VTH (inv) of inverter 34, as shown in FIG. 7. The output voltage VA increases up to the level equal to the threshold voltage VTH, as shown in FIG. 7, due to the change of output voltage VA. However, the logic level of the output voltage VB is not inverted, so long as output voltage VA does not exceed the threshold voltage VTH (inv) of the inverter 34, i.e. ½ VD.

When power voltage below VD drops the predetermined value VRF, output voltage VA is set higher than the level of ½ VD. At this time, the logic level of output voltage VB is inverted from high to low in level to reset flip-flop 36. If power voltage VD further lessens to less than the threshold voltage VTH (tr) of the MOS transistor 40, MOS transistor 40 is turned off, and output voltage VA is set to the same level as power voltage VD. During this period, output voltage VA is always held at a level higher than threshold voltage VTH (inv) of the inverter 34, i.e., ½ VD. Inverter 34 produces ground level output voltage VB after transistor 40 is turned off, and keeps flip-flop 36 in a reset state. Flip-flop 36 is released from its reset state when power voltage VD is returned to the VDD level, for example, by a voltage signal supplied from microcomputer circuit 30 to the set terminal $\bar{S}$ of flip-flop 36.

According to the first embodiment, the operation of voltage dividing circuit can be controlled through bonding pad 26A. For this reason, in the test mode, the standby current of the LSI can be measured without any effect from the consumed current of the power voltage drop detecting circuit 28. In the detection mode, any drop in the power voltage VD can be detected accurately.

Figure 8:
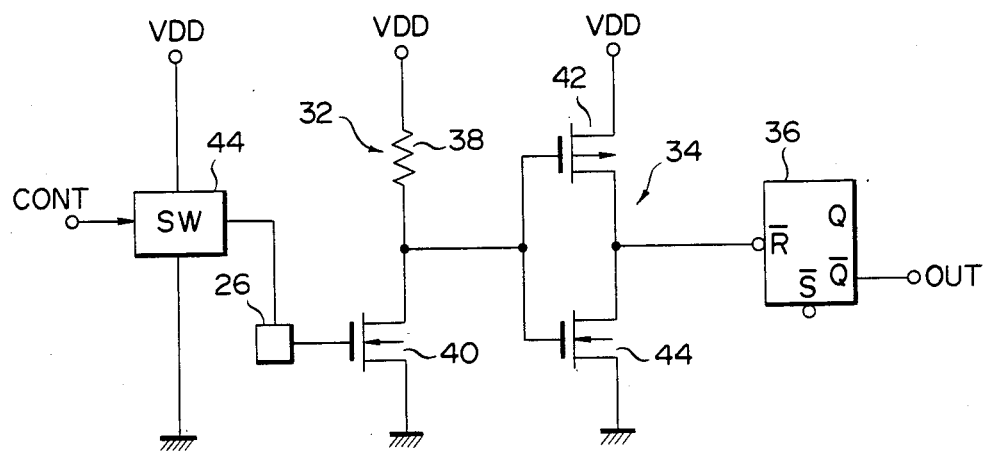
FIG. 8 shows a circuit diagram of a power voltage detecting circuit according to a second embodiment of the present invention in which a switching circuit 44 is provided to the detecting circuit of FIG. 6.

FIG. 8 shows a power voltage drop detecting circuit according to a second embodiment of the invention. In the figure, like reference numerals are used for designating like portions in the figures of the first embodiment. In this embodiment, switching circuit 44 is additionally provided to the detecting circuit 28 of the first embodiment. The output terminal of switching circuit 44 is connected to the gate of MOS transistor 40. This switching circuit 44 normally sets the gate potential of MOS transistor 40 at the same level as that of the VDD terminal. In addition, switching circuit 44 responds to a control signal CONT generated by microcomputer circuit 30, for example, and sets the gate potential of MOS transistor 40 at the same level as that of the ground terminal.

More specifically, when power voltage detecting circuit of FIG. 8 is not supplied with control signal CONT, it detects a drop of power voltage VD. When supplied with control signal CONT, it stops the operation. During the period that the detecting circuit stops, MOS transistor 40 is turned off by the ground level voltage, to prevent the current consumption by voltage dividing circuit 32.

According to the second embodiment, the same effects can be obtained as with the first embodiment, and no exclusive package pins are needed for mode control of the power voltage drop detecting circuit. In other words, the power voltage drop detecting circuit of the second embodiment is suitable for such a case that the number of package pins for that LSI device is decided beforehand, and to increase the number would be unreasonable.

Figure 9:
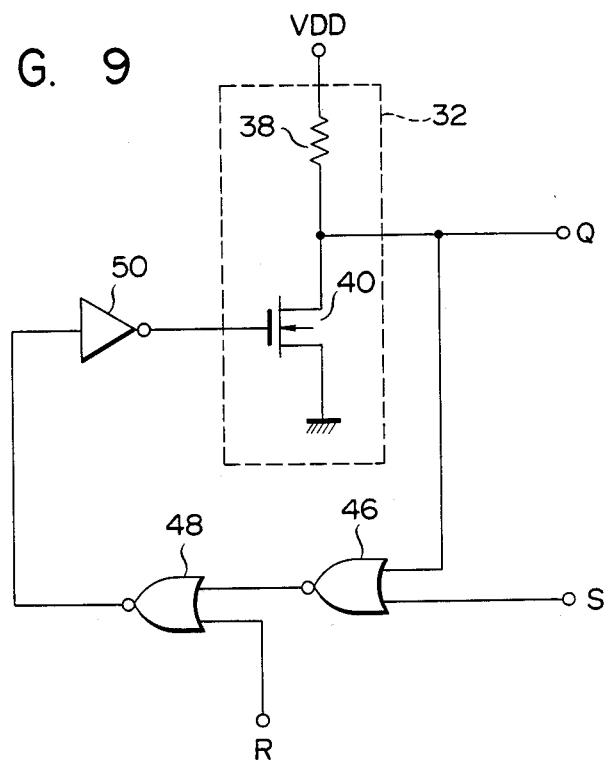
FIG. 9 shows a circuit diagram of a power voltage detecting circuit according to a third embodiment of the present invention, in which a voltage dividing circuit 32 constitutes a part of a flip-flop circuit.

FIG. 9 shows a third embodiment of a power voltage detecting circuit according to the present invention. Also in this figure, like reference symbols are used for designating like portions in the figures of the first and second embodiments. In this detecting circuit, voltage dividing circuit 32 is used as a part of a flip-flop circuit. The detecting circuit additionally contains CMOS NOR gates 46 and 48 and CMOS inverter 50. The output terminal of voltage dividing circuit 32, i.e. the junction between diffusion resistor 38 and MOS transistor 40, is connected to output terminal Q and the first input terminal of NOR gate 46. The second input terminal of NOR gate 46 is connected to set terminal S. The input terminal of NOR gate 48 is connected to the output terminal of NOR gate 46. The second input terminal of NOR gate 48 is connected to reset terminal R. The output terminal of NOR gate 48 is connected to the control gate of MOS transistor 40, through inverter 50.

Figure 1:
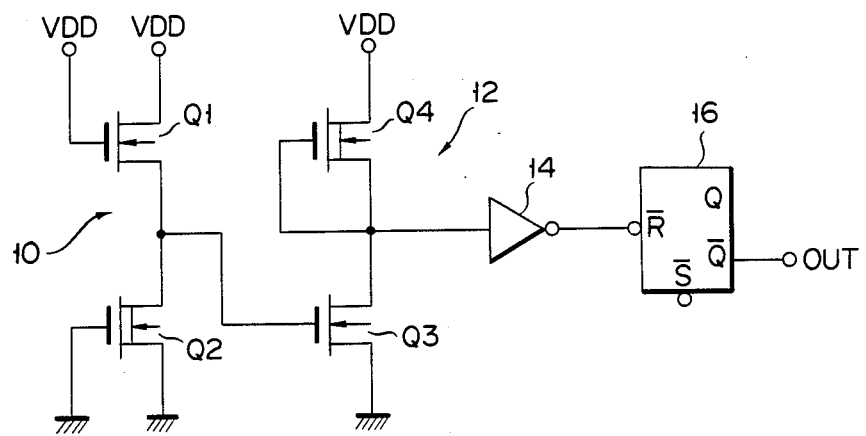
FIG. 1 is a circuit diagram of a conventional power voltage drop detector.
Figure 2:
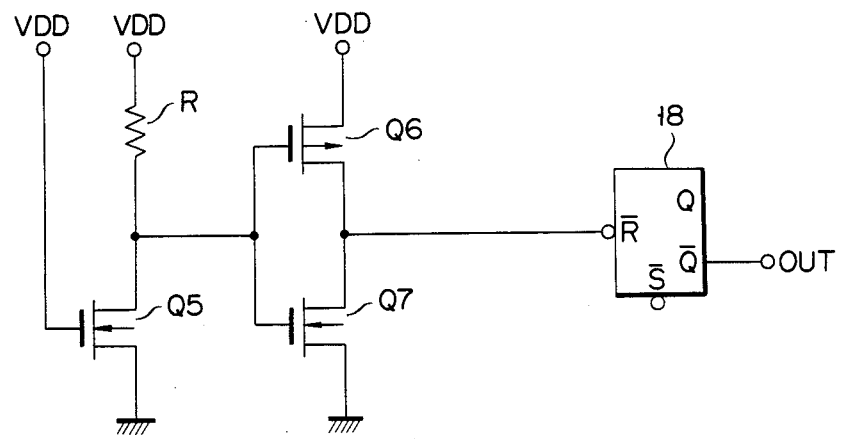
FIG. 2 is a power voltage drop detecting circuit when circuit elements of the detecting circuit of FIG. 1 are replaced by CMOS type circuit elements.
Figure 3:
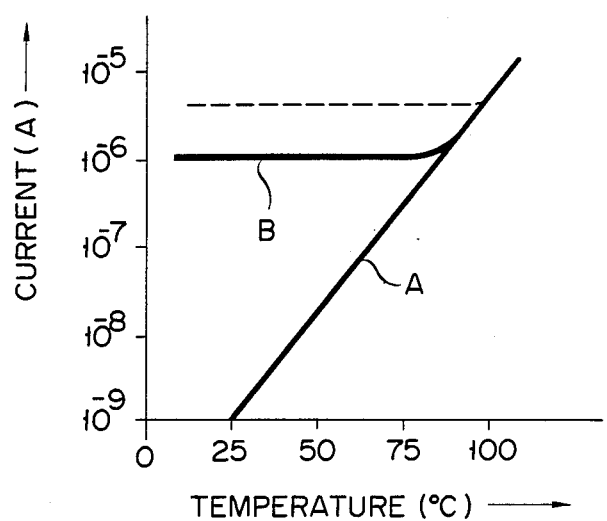
FIG. 3 shows a graph illustrating the relationship between the standby current of the CMOS LSI and the consumed current of the power voltage drop detecting circuit of FIG. 2.

The operation of the power voltage drop detecting circuit will be described. For detecting a drop of power voltage VD, a low level voltage is supplied from microcomputer circuit 30 shown in FIG. 2 to the set and reset terminals. When power voltage VD is above the predetermined value VRF, current flows into the current path of transistor 40. By this current flow, voltage dividing circuit 32 produces an output signal at low level and supplies it to the output terminal Q and NOR gate 46. At this time, NOR gates 46 and 48 produce output signals in high and low levels, respectively. The output signal of NOR gate 48 is inverted into a high level signal by means of inverter 50, and the inverted one is transferred to MOS transistor 40. The output signal of inverter 50 does not turn off MOS transistor 40. The detection circuit automatically maintains the conductive state of MOS transistor 40.

On the other hand, when power voltage VD drops below the predetermined value VRF, the thresold voltage of NOR gate 46 changes to a lower value than that of the output voltage of voltage dividing circuit 32. As a result, NOR gate 46 produces a low level signal. According to a change in the output signal of NOR gate 46, NOR gate 48 produces a high level signal. The output signal of NOR gate 48 is inverted into a low level signal by inverter 50 and is applied to MOS transistor 40. The output signal of inverter 50 turns off transistor 40. At this time, the output signal of NOR gate 46 does not change from low level. Thus, the detecting circuit automatically maintains the nonconductive state of MOS transistor 40.

When transistor 40 is released from its nonconductive state, a high level voltage is supplied from microcomputer circuit 30, for example, to the reset terminal R. Responsive to this voltage signal, NOR gate 48 produces a low level signal. The output signal of NOR gate 48 is inverted into a high level and turns on transistor 40. As a result, a drop of the power voltage is monitored again.

With this detecting circuit, when a power voltage drop is detected, transistor 40 is rendered conductive so that the current consumption by voltage dividing circuit 32 is sufficiently reduced. As a result, in measuring the standby current of LSI, power voltage VD is set to a value lower than the predetermined value VRF so that MOS transistor 40 is automaticaly made nonconductive. In this condition, the standby current is never buried in the consumed current of the power voltage drop detecting circuit and can be accurately measured.

According to this third embodiment, the number of circuit terminals needed for this power voltage drop detecting circuit is reduced from the number in the first and second embodiments. Also, simply by setting power voltage VD at low level, the consumed current of the detecting circuit can be sufficiently reduced. This embodiment of the detector circuit does not need a independent terminal to receive a control signal to reduce the consumed current.

If the above circuit is used only when a power voltage drop is detected, the set terminal S would not be needed. All that is required is to replace first gate 46 with an inverter. In the above circuit, however, when a power supply is turned on, the output terminal Q can be self-maintained at a high level. If a high level voltage signal is applied to the reset terminal R, the output terminal Q is set at a high level. If a high level voltage signal is applied to the set terminal S, the voltage at the output terminal Q is set at a high level. Since the above circuit forms a flip-flop which is made a set state responsive to power supply, the circuit can be used for detecting power on and holding the detected state. If the output terminal Q is replaced by the output terminal e,ovs/Q/ , the above circuit serves as a flip-flop which is made a reset state responsive to power supply.

The present invention is not limited to the above-mentioned embodiments. It should be noted that the voltage drop detecting circuit contains a control circuit for feeding back the output signal of voltage dividing circuit 32 to the gate of MOS transistor 40 to allow voltage dividing circuit 32 to self-maintain the state that the power voltage drop or the power on is detected. The detecting circuit may be constructed not only with the CMOS integrated circuit but also with discrete components. Further, voltage dividing circuit 32 may be formed of a p-channel enhancement type MOS transistor and resistor.

Figure 10:
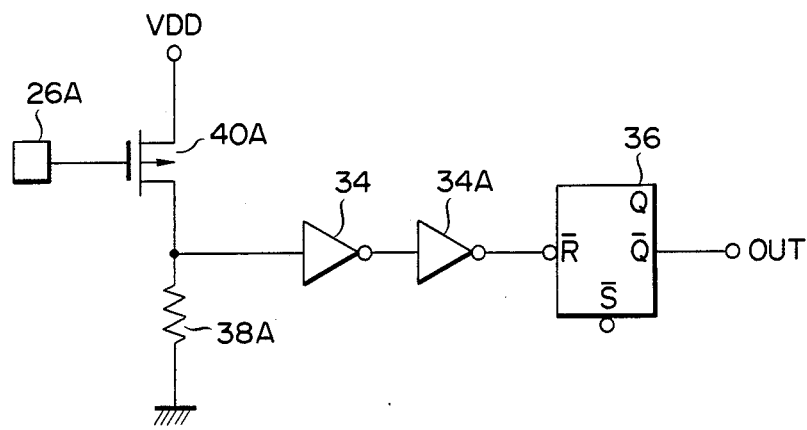
FIGS. 10 and 11 show fourth and fifth embodiments of the present invention, in which a p-channel MOS transistor and diffusion resistor form a voltage dividing circuit.

FIG. 10 shows a power voltage drop detecting circuit having a p-channel MOS transistor 40A and diffusion resistor 38A. One end of resistor 38A is connected to the VDD terminal through the current path of MOS transistor 40A, and the other end of resistor 38A is grounded. Pad 26A is connected to the gate of MOS transistor 40A. The detecting circuit further has a inverter 34A between the output terminal of inverter 34 and the reset terminal R̄ of flip-flop 36.

With the detecting circuit of FIG. 10, control voltage VC of high level and low level is applied to bonding pad 26A at the test and detection modes, respectively.

Figure 11:
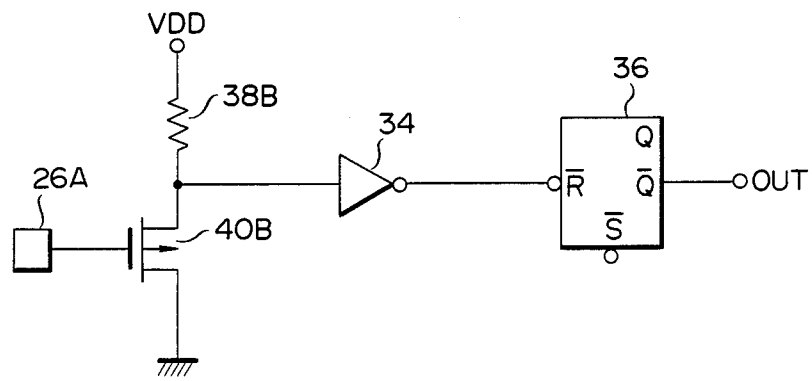

FIG. 11 shows a power voltage drop detecting circuit having a p-channel MOS transistor 40B and diffusion resistor 38B. One end of resistor 38B is connected to the VDD terminal, and the other end of resistor 38B is grounded through the current path of MOS transistor 40B. Pad 26A is connected to the gate of MOS transistor 40B.

With the detecting circuit of FIG. 11, control voltage VC of high level and low level is applied to bonding pad 26A at the test and detection modes, respectively.

What is claimed is:

1. A power voltage drop detecting circuit formed on an LSI chip accommodated in a package having pins, said circuit comprising:
   first and second power source terminals supplied with power voltage and set at a positive potential and a ground potential, respectively;
   a voltage dividing circuit, having a resistive means and a MOS transistor, for dividing the power voltage, said resistive means being connected at one end to said first power source terminal directly and at the other end to said second power source terminal via the current path of said MOS transistor;
   a CMOS inverter for producing an output voltage according to the output voltage of said voltage dividing circuit;
   a control pad connected to a pin of said LSI chip package and to a gate of said MOS transistor and set at different potentials in test and detection modes, respectively; and
   a CMOS RS flip-flop having a reset terminal responsive to an inverted output signal of said CMOS inverter.

2. A power voltage drop detecting circuit according to claim 1, wherein said MOS transistor is of n-channel type.

3. A power voltage drop detecting circuit according to claim 1, wherein said MOS transistor is of p-channel type.

4. A power voltage drop detecting circuit to be formed on an LSI chip comprising:
   first and second power source terminals supplied with power voltage and set at positive potential and a ground potential, respectively;
   a voltage dividing circuit, having resistive means and a n-channel MOS transistor, for dividing the power voltage, said resistive means being connected at one end to said first power source terminal directly and at the other end to said second power source terminal via the current path of said MOS transistor; and
   a control circuit for causing said voltage dividing circuit to self-hold a conduction state of said MOS transistor by feeding back the output voltage of said voltage dividing circuit to a gate of said MOS transistor, said control circuit including a first inverter which receives the output voltage from the junction of said resistive means and said MOS transistor, a NOR gate circuit which receives the output voltage of said first inverter and a voltage for a reset control, and a second inverter for inverting the output voltage of said NOR gate circuit to supply an inverted output voltage to said gate of said MOS transistor.

5. A power voltage drop detecting circuit formed on an LSI chip accommodated in a package having pins, said circuit comprising:
   first and second power source terminals supplied with power voltage and set at a positive potential and a ground potential, respectively;
   a voltage dividing circuit, having resistive means and a MOS transistor, for dividing the power voltage, said resistive means being connected at one end to said second power source terminal directly and at the other end to said first power source terminal via the current path of said MOS transistor;
   a first CMOS inverter for producing an output voltage according to the output voltage of said voltage dividing circuit;
   a control pad connected to a pin of said LSI chip package and to a gate of said MOS transistor and set at different potentials in test and detection modes, respectively;
   a second CMOS inverter for inverting the output signal of said first CMOS inverter; and
   a CMOS RS flip-flop having a reset terminal responsive to an inverted output signal of said second CMOS inverter.

6. A power voltage drop detecting circuit to be formed on an LSI chip comprising:
   first and second power source terminals supplied with power voltage and set at a positive potential and a ground potential, respectively;
   a voltage dividing circuit, having resistive means and a n-channel MOS transistor, for dividing the power voltage, said resistive means being connected at one end to said first power source terminal directly and at the other end to said second power source terminal via the current path of said MOS transistor; and
   a control circuit for causing said voltage dividing circuit to self-hold a conduction state of said MOS transistor by feeding back the output voltage of said voltage dividing circuit to a gate of said MOS transistor, said control circuit including a first NOR gate circuit which receives a voltage for a set control and the output voltage from the junction of said resistive means and said MOS transistor, a second NOR gate circuit which receives the output voltage of said first NOR gate circuit and a voltage for a reset control, and an inverter for inverting the output voltage of said second NOR gate circuit to supply an inverted output to said gate of said MOS transistor.

7. A power voltage drop detecting circuit according to claim 6, wherein said first and second NOR gate circuits and said inverter are of CMOS type.

* * * * *